United States Patent
Sugiyama et al.

(10) Patent No.: US 6,217,952 B1
(45) Date of Patent: *Apr. 17, 2001

(54) METHOD OF FORMING FILMS OVER INNER SURFACE OF CYLINDRICAL MEMBER

(75) Inventors: Osamu Sugiyama, Hanno; Yukio Miya, Kawagoe; Ryota Koike, Tokorozawa; Takashi Toida, Suginami; Toshiichi Sekine, Kamifukuoka, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/456,472

(22) Filed: Dec. 9, 1999

Related U.S. Application Data

(62) Division of application No. 08/730,156, filed on Oct. 15, 1996, now Pat. No. 6,126,793.

(30) Foreign Application Priority Data

Oct. 17, 1995 (JP) .................................................. 7-268145
Jul. 8, 1996 (JP) .................................................. 8-177844

(51) Int. Cl.[7] .............................. H05H 1/24; C23C 14/34; C23C 8/00
(52) U.S. Cl. ...................... 427/577; 427/585; 427/237; 427/249.7; 204/192.12; 204/192.15
(58) Field of Search ................... 204/192.12, 192.15; 427/577, 585, 237, 239, 249.7

(56) References Cited

U.S. PATENT DOCUMENTS

| | | | |
|---|---|---|---|
| 4,374,722 | 2/1983 | Zega | 204/298 |
| 4,859,490 | 8/1989 | Ikegaya et al. | 427/38 |
| 5,511,587 | 4/1996 | Miya et al. | 139/192 |
| 5,605,714 | 2/1997 | Dearnaley et al. | 427/2.24 |
| 5,626,963 | 5/1997 | Hirano et al. | 428/408 |
| 5,688,557 | 11/1997 | Lemelson et al. | 427/249 |
| 5,693,376 | 12/1997 | Fetherston et al. | 427/523 |
| 5,719,410 | 2/1998 | Sueshiro et al. | 257/77 |
| 5,879,763 | * 3/1999 | Sugiyama et al. | 427/577 |
| 5,922,418 | * 7/1999 | Koike et al. | 427/577 |
| 5,939,152 | * 8/1999 | Sugiyama et al. | 427/577 |
| 6,020,036 | * 2/2000 | Sugiyama et al. | 427/577 |
| 6,033,533 | * 3/2000 | Sugiyama et al. | 204/192.12 |
| 6,056,443 | * 5/2000 | Koike et al. | 384/296 |

FOREIGN PATENT DOCUMENTS 56-6920  1/1981  (JP) .

\* cited by examiner

*Primary Examiner*—Nam Nguyen
*Assistant Examiner*—Steven H. Ver Steeg
(74) *Attorney, Agent, or Firm*—Armstrong, Westerman, Hattori, McLeland & Naughton, LLP

(57) ABSTRACT

The present invention relates to a method of forming an intermediate film and a hard carbon film over the inner surface of a cylindrical member having a bore, such as a bushing or a cylinder, with the hard carbon film being formed on the intermediate film with a uniform thickness, greatly enhancing of abrasion resistance of the inner surface. The cylindrical member is placed in a vacuum vessel, an auxiliary electrode of an intermediate film forming material, such as a titanium-silicon alloy or the like, is inserted in the bore of the cylindrical member, a sputtering gas is supplied into the vacuum vessel, a voltage is applied to the auxiliary electrode to produce a plasma around the auxiliary electrode in order that the intermediate film forming material is sputtered from the auxiliary electrode and an intermediate film is formed over the inner surface of the cylindrical member. Subsequently, a gas containing carbon, such as methane gas or the like, is supplied into the vacuum vessel, and a voltage is applied to the cylindrical member to produce a plasma in the vacuum vessel in order that a hard carbon film (DLC film) is formed on the previously formed intermediate film over the inner surface of the cylindrical member.

9 Claims, 8 Drawing Sheets

METHOD OF FORMING FILMS OVER INNER SURFACE OF CYLINDRICAL MEMBER

This application is a division of prior application Ser. No. 08/730,156, filed Oct. 15, 1996 now U.S. Pat. No. 6,126,793.

BACKGROUND OF THE INVENTION

1. Field of the Invention

The present invention relates to a method of forming films over the inner circumference (surface) of a cylindrical member and, more particularly, to a method of forming a film consisting of a hard carbon film for enhancing the abrasion resistance of the inner surface of a cylindrical member (part), such as a bushing, a cylinder in which a piston reciprocates or a bearing, and an intermediate film (layer) formed between the hard carbon film and the inner surface of the cylindrical member which is capable of sticking to both the inner surface of the cylindrical member and the hard carbon film with high adhesion.

2. Description of the Prior Art

A hard carbon film is black and has properties similar to those of diamond. A hard carbon film has advantageous properties including a high mechanical hardness, a small friction coefficient with other materials, a high electrical insulation property, a large thermal conductivity and a high corrosion resistance. Accordingly, there have been proposals for coating various devices, including, medical instruments, magnetic heads, tools and such with a hard carbon film.

A hard carbon film is a hydrogenated amorphous carbon film having properties very similar to those of diamond and hence a hard carbon film is often called a diamondlike carbon film (DLC film) or an i-carbon film.

Proposed in JP-A No. 56-6920 is a film forming method of forming a hard carbon film with high adhesion on a surface of a base member. This previously proposed film forming method forms an intermediate film of silicon or a silicon compound over a surface of a base member by sputtering using a gas containing argon gas (Ar gas) and carbon, and then a hard carbon film is formed on the intermediate film.

Such a prior art method of forming a film consisting of an intermediate film and a hard carbon film over the inner surface of a cylindrical member (base member) of carbon tool steel, such as a bushing, will be described with reference to FIG. 10.

Referring to FIG. 10 showing a film forming apparatus for carrying out the prior art method of forming a film consisting of an intermediate film and a hard carbon film overlying the intermediate film, a target 37 of an intermediate film forming material, such as silicon or a silicon compound, and a cylindrical member 11 having a bore 11a defined by an inner surface 11b, are disposed opposite to each other in a vacuum vessel 13.

Gases are removed through a gas outlet port 17 from the vacuum vessel 13 by an evacuating means, not shown, to evacuate the vacuum vessel 13. Then, Ar gas, i.e., a sputtering gas, is supplied through a gas inlet port 15 into the vacuum vessel 13. A negative DC voltage is applied to the target 37 by a first power source 39 and a negative DC voltage is applied to the cylindrical member 11 by a second DC power source 25.

A plasma is thus produced within the vacuum vessel 13 to make the target 37 sputter by bombarding the surface of the target 37 with ions. Consequently, particles of the material forming the target 37 are deposited over the inner surface 11b of the cylindrical member 11 thus forming an intermediate film of silicon or a silicon compound.

Next, a hard carbon film is formed on the intermediate film by a conventional film forming method using an apparatus as shown in FIG. 11.

Referring to FIG. 11, the cylindrical member 11 having its inner surface 11b deposited with the intermediate film is placed in a vacuum vessel 13 provided with a gas inlet port 15 and a gas outlet port 17. The vacuum vessel 13 is evacuated by an evacuating means, not shown. Then, a gas which contains carbon is supplied through the gas inlet port 15 into the vacuum vessel 13 and the pressure in the vacuum vessel 13 is adjusted to a set pressure.

A positive DC voltage is applied to an anode 31 placed within the vacuum vessel 13 by an anode power source 27, an AC voltage is applied to a filament 33 by a filament power supply 29, and a negative DC voltage is applied to the cylindrical member 11 by a DC power source 25. Thus, a plasma is produced in the vacuum vessel 13 to deposit a hard carbon film on the intermediate film formed over the inner surface of the cylindrical member 11.

The hard carbon film forming method using the apparatus shown in FIG. 11 uses the plasma produced by the DC voltage applied to the cylindrical member 11 and the plasma produced by the filament 33 energized by an AC voltage and the anode 31 energized by the DC voltage. Either the plasma produced around the cylindrical member 11 or the plasma produced around the filament 33 and the anode 31 contributes mainly to hard carbon film formation depending on the pressure in the vacuum vessel 13 during hard carbon film formation.

For example, when the pressure in the vacuum vessel 13 is $3 \times 10^{-3}$ torr or above, the plasma produced around the cylindrical member 11 mainly contributes to the decomposition of the gas containing carbon to form the hard carbon film.

Although a carbon film can be formed uniformly over the outer surface of the cylindrical member 11 by the dominant contribution of this plasma, a carbon film formed over the inner surface 11b defining the bore 11a is inferior in adhesion, hardness and quality. This is because the same voltage is applied to the cylindrical member 11, and the inner surface 11b defines a space in which electrodes of the same polarity are disposed opposite to each other, and the plasma prevailing in the bore 11a causes an abnormal discharge called hollow discharge. A hard carbon film formed by hollow discharge is a polymerlike film inferior in adhesion and apt to come off the cylindrical member 11 and have a relatively low hardness.

When the pressure in the vacuum vessel 13 is below $3 \times 10^{-3}$ torr, the plasma produced in the neighborhood of the filament 33 and the anode 31 contributes mainly to hard carbon film formation.

Although a hard carbon film can uniformly be formed over the outer surface of the cylindrical member 11 by the dominant contribution of this plasma, the hard carbon film cannot be formed in a uniform thickness with respect to a direction along the axis of the cylindrical member 11 over the inner surface 11b defining the bore 11a. Carbon ions produced by the plasma produced around the filament 33 and the anode 31 are attracted to the surface of the cylindrical member 11 by the negative DC potential of the cylindrical member 11 to deposit the hard carbon film over the surface of the cylindrical member 11.

The hard carbon film is formed by a chemical vapor deposition process when the pressure in the vacuum vessel 13 is above $3\times10^{-3}$ torr, and the hard carbon film is formed by a physical vapor deposition process when the pressure in the vacuum vessel 13 is below $3\times10^{-3}$ torr. Therefore, the thickness of the hard carbon film formed over the inner surface 11b of the cylindrical member 11 decreases from the open end of the bore 11a downwards with the depth, which occurs when forming a film by a physical vapor-phase epitaxial growth process, such as a vacuum deposition process, when the plasma produced around the filament 33 and the anode 31 contributes mainly to hard carbon film formation. Consequently, the hard carbon film cannot be formed in a uniform thickness over the entire inner surface 11b of the cylindrical member 11.

Similarly, the thickness of the intermediate film formed over the inner surface 11b of the cylindrical member 11 decreases from the open end of the bore 11a downwards with the depth when the intermediate film is formed by the method previously described with reference to FIG. 10.

FIG. 12 is a graph showing a thickness distribution in an intermediate film formed over the inner surface of a cylindrical member, in which distance from the open end of the cylindrical member is measured on the horizontal axis and thickness is measured on the vertical axis. In FIG. 12, curve a indicates the variation of the thickness of the intermediate film formed by the method described in reference to FIG. 10 with the distance from the open end of the bore of the cylindrical member.

As is obvious from curve a, the thickness of an intermediate film formed by the conventional method decreases sharply from 0.5 $\mu$m at the open end of the bore to 0.1 $\mu$m at a position 30 mm from the open end.

When a hard carbon film is formed on the intermediate film having such a sharply changing thickness, the portion of the hard carbon film formed in the vicinity of the open end of the cylindrical member sticks to the intermediate film with a high adhesion, whereas the adhesion of the portion of the hard carbon film formed in the depth of the bore decreases with the distance from the open end. Therefore, the portion formed in the depth of the bore is apt to come off.

Since the portion of the intermediate film in the depth of the cylindrical member is thin and is unable to withstand stress induced in the hard carbon film, the intermediate film and the hard carbon film come off the cylindrical member. This is a problem.

Thus, the hard carbon film formed by the conventional method over the inner surface of a cylindrical member cannot fully exercise its advantageous characteristics including high abrasion resistance and high corrosion resistance.

SUMMARY OF THE INVENTION

It is an object of the present invention to solve the foregoing problems, and to form an intermediate film with a uniform thickness over the inner surface of a cylindrical member and form a hard carbon film with a uniform thickness on the intermediate film so as to stick to the intermediate film with a high adhesion.

With this object in view, the present invention provides a film forming method comprising: an intermediate film forming process for forming an intermediate film capable of sticking to a hard carbon film with a high adhesion over the inner surface of a cylindrical member, and a hard carbon film forming process for forming a hard carbon film on the intermediate film.

In both the intermediate film forming process and the hard carbon film forming process, an auxiliary electrode is inserted in the bore of the cylindrical member defined by the inner surface, and a voltage is applied across the auxiliary electrode and the cylindrical member to form a film by a plasma sputtering process, a resistance heating evaporation process or a chemical vapor deposition process (CVD process).

In the intermediate film forming process, a one-layer intermediate film or a two-layer intermediate film is formed. A metal carbide or metal silicide one-layer intermediate film is formed by sputtering or resistance heating evaporation using an auxiliary electrode of a material for forming the intermediate film by supplying a sputtering gas (Ar gas) and a gas containing carbon or silicon into a vacuum vessel. The metal carbide or the metal silicide is produced by the reaction between particles of the material forming the auxiliary electrode sputtered from the auxiliary electrode and carbon or silicon contained in the gas.

A two-layer intermediate film is constructed by forming a first intermediate film (lower layer) capable of sticking to the inner surface of a cylindrical member with a high adhesion over the inner surface of the cylindrical member by sputtering or resistance heating evaporation using an auxiliary electrode of a first material, and forming a second intermediate film (upper layer) capable of sticking to a hard carbon film with a high adhesion on the first intermediate film by sputtering or resistance heating evaporation using an auxiliary electrode of a second material. A two-layer intermediate film may also be constructed by forming the first intermediate film over the inner surface of the cylindrical member by sputtering or resistance heating evaporation using an auxiliary electrode, and forming the second intermediate film of a metal carbide or a metal silicide by supplying a sputtering gas (Ar gas) and a gas containing carbon or silicon into a vacuum vessel to deposit a metal carbide film or a metal silicide film through the reaction between the metal sputtered from the auxiliary electrode and carbon or silicon contained in the gas.

In either case, the cylindrical member is placed in a vacuum vessel and kept at a grounded potential or a floating potential, and a negative DC voltage, a high-frequency voltage or an AC voltage is applied to the auxiliary electrode.

In the hard carbon film forming process, the cylindrical member provided with the intermediate film over its inner surface is placed in a vacuum vessel, and an auxiliary electrode connected to a ground is inserted in the bore of the cylindrical member. Then, the vacuum vessel is evacuated, a gas containing carbon, such as benzene gas ($C_6H_6$ gas) or methane gas ($CH_4$ gas) is supplied into the vacuum vessel, a voltage is applied to the cylindrical member to produce a plasma within the vacuum vessel, and a hard carbon film is formed by a CVD process on the intermediate film formed over the inner surface of the cylindrical member.

The plasma is produced by applying a negative DC voltage or a high-frequency voltage to the cylindrical member or by applying a DC voltage to the cylindrical member and applying a DC voltage to an anode disposed in the vacuum vessel and applying an AC voltage to a filament disposed in the vacuum vessel.

The intermediate film forming process and the hard carbon film forming process may be carried out in separate vacuum vessels, or may continuously be carried out in one vacuum vessel.

The cylindrical member is a member having an inner surface to be brought into contact with another member, such as a guide bushing, a cylinder or a bearing and may be a cylindrical member having one or both ends open. Generally, the present invention is applied to a cylindrical member made of a carbon tool steel (SK steel). However, the present invention is applicable to a cylindrical member made of an insulating material, such as a ceramic material, and a cylindrical member formed by coating the inner surface of a cylindrical base with a cemented carbide or a ceramic material by brazing or the like.

When the cylindrical member is made of an insulating material, the cylindrical member cannot be kept at a ground potential and is kept at a floating potential during the intermediate film forming process. However, positive ions of the material for forming the intermediate film sputtered from the auxiliary electrode are attracted to the inner surface of the cylindrical member at a floating potential lower than that of the ions, so that an intermediate film can be deposited over the inner surface of the cylindrical member.

In the hard carbon film forming process, a metal intermediate film can be formed over the inner surface of the cylindrical member even if the same is made of an insulating material because the inner surface is first coated with the metal intermediate film and then a voltage can be applied to the cylindrical member.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the present invention will be described hereinafter with reference to the accompanying drawings.

Figure 1:
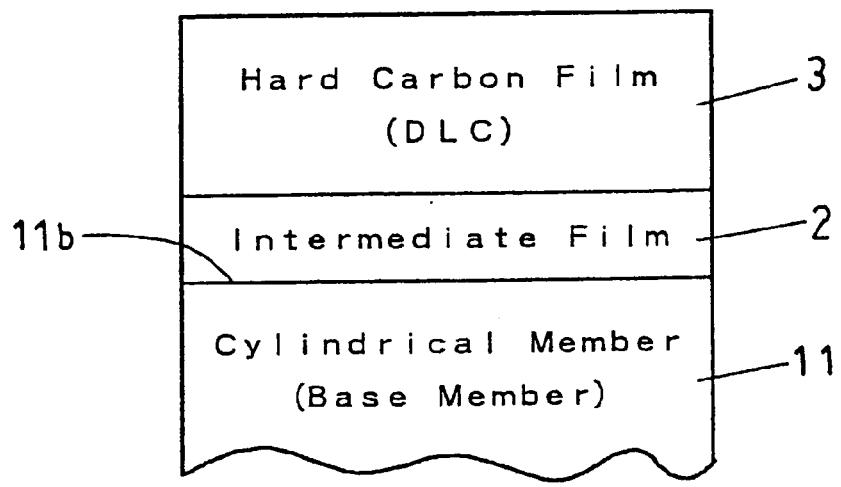
FIGS. 1 and 2 are enlarged typical sectional views of films to be formed over the inner surfaces of a cylindrical member by film forming methods in accordance with the present invention.
Figure 2:
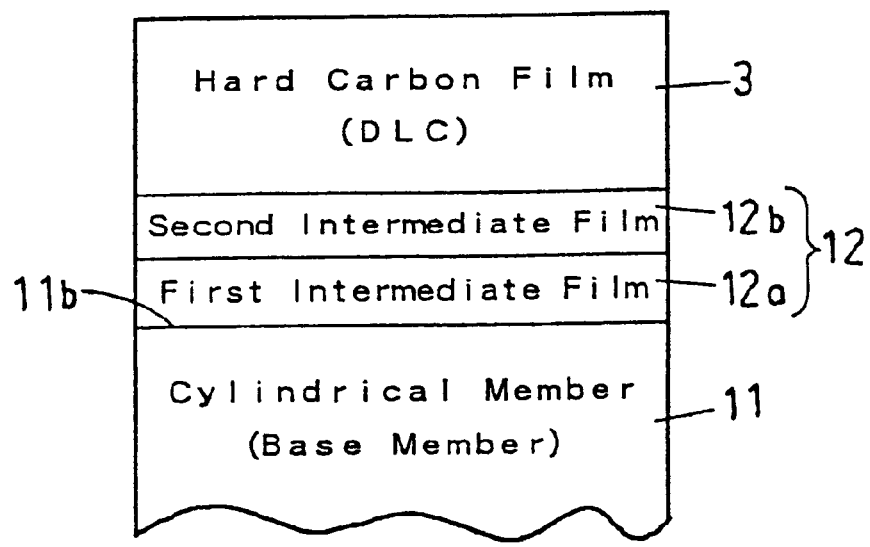

FIGS. 1 and 2 are enlarged typical views of films to be formed over the inner surface of a cylindrical member by a film forming method in accordance with the present invention.

Referring to FIGS. 1 and 2, a film forming method in accordance with the present invention comprises an intermediate film forming process for forming an intermediate film 2 or 12 over the inner surface 11$b$ of a cylindrical member 11 for enhancing adhesion to the hard carbon film, and a hard carbon film forming process for forming a hard carbon film (DLC film) 3 on the intermediate film 2 or 12.

The intermediate film 2 is a one-layer film as shown in FIG. 1 and the intermediate film 12 is a two-layer film consisting of a first intermediate film 12$a$ (lower film) and a second intermediate film 12$b$ (upper film) as shown in FIG. 2.

The one-layer intermediate film 2 shown in FIG. 1 is made of a titanium-silicon alloy (metal silicide), a titanium-carbon alloy (metal carbide) or the like.

The first intermediate film 12$a$ of the two-layer intermediate film 12 shown in FIG. 2 is made of titanium (Ti), chromium (Cr), molybdenum (Mo), tungsten (W), tantalum (Ta) or aluminum (Al), etc., and the second intermediate film 12$b$ is made of a titanium-silicon alloy (a metal silicide) film, a metal carbide film, such as a titanium-carbon alloy (titanium carbide) film, or silicon (Si) or germanium (Ge).

In both the intermediate film forming process and the hard carbon film forming process, an auxiliary electrode is inserted in the bore of the cylindrical member 11 defined by the inner surface 11$b$ for film formation.

Figure 3:
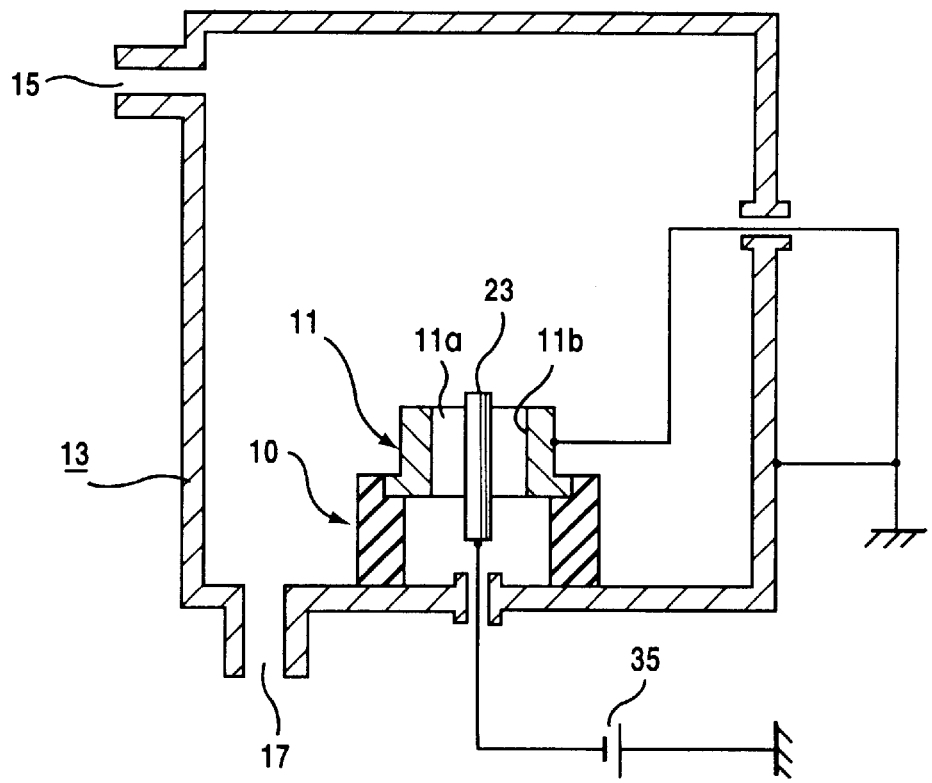
FIG. 3 is a schematic sectional view for explaining a film forming apparatus for carrying out an intermediate film forming process included in a film forming method in an embodiment according to the present invention.

One-Layer Intermediate Film Forming Process in Example 1: FIG. 3

A one-layer intermediate film forming process in Example 1 for forming the one-layer intermediate film 2 over the inner surface of a cylindrical member will be described with reference to FIG. 3, on an assumption that the one-layer intermediate film 2 shown in FIG. 1 is made of a titanium-silicon alloy.

Referring to FIG. 3, a cylindrical member 11 having a bore 11$a$ is fixedly mounted at the bottom thereof on an insulating work support 10 in a vacuum vessel 13 provided with a gas inlet port 15 and a gas outlet port 17. The cylindrical member 11 is a member such as a bushing, a cylinder or a bearing, made of a metal, for example, such as a carbon tool steel (SK steel). The cylindrical member 11 and the vacuum vessel 13 are connected to a ground to keep the same at a ground potential.

A rod-shaped auxiliary electrode 23 of a titanium-silicon alloy is inserted in the bore 11$a$ of the cylindrical member 11 coaxially with the latter. In this example, the titanium-silicon alloy forming the auxiliary electrode 23 contains 30% to 70% by weight percentage silicon.

The vacuum vessel 13 is evacuated to a vacuum of $3 \times 10^{-5}$ torr by an evacuating means, not shown. Then, Ar gas, i.e., a sputtering gas, is supplied through the gas inlet port 15 into the vacuum vessel 13 so that the interior of the vacuum vessel 13 is kept at a vacuum of $5 \times 10^{-3}$ torr.

A DC power source 35 applies $-500$ V DC to the auxiliary electrode 23 to produce a plasma around the auxiliary electrode 23 in the bore 11$a$ of the cylindrical member 11. The surface of the auxiliary electrode 23 is bombarded with the ions of the plasma and the auxiliary electrode 23 sputters atoms of the titanium-silicon alloy.

For example, it is preferable that the diameter of the auxiliary electrode 23 is about 2 mm when the inside diameter of the cylindrical member 11 (the diameter of the bore 11$a$) is 10 mm. The auxiliary electrode 23 need not necessarily have a circular section, but may have a triangular section, a square section or any other polygonal section.

Molecules of the materials for forming the intermediate film are sputtered from the surface of the auxiliary electrode 23 and deposited on the inner surface 11b of the cylindrical member 11 to form the intermediate film of the titanium-silicon alloy (metal silicide film). The sputtering is continued for 30 minutes to form a 0.5 µm thick titanium-silicon alloy film as the intermediate film in the interior of the bore of the cylindrical member 11.

Thus, in the intermediate film forming process in this embodiment, the auxiliary electrode 23 of the material for forming the intermediate film is inserted in the bore 11a of the cylindrical member 11 and a plasma is produced around the auxiliary electrode 23 in the bore 11a to form the intermediate film over the inner surface 11b of the cylindrical member 11. Since the plasma produced around the auxiliary electrode 23 in the bore 11a of the cylindrical member 11 has a uniform ion density distribution along the axis of the cylindrical member 11, the intermediate film 2 (FIG. 1) can be formed over the inner surface 11b in a uniform thickness.

Figure 4:
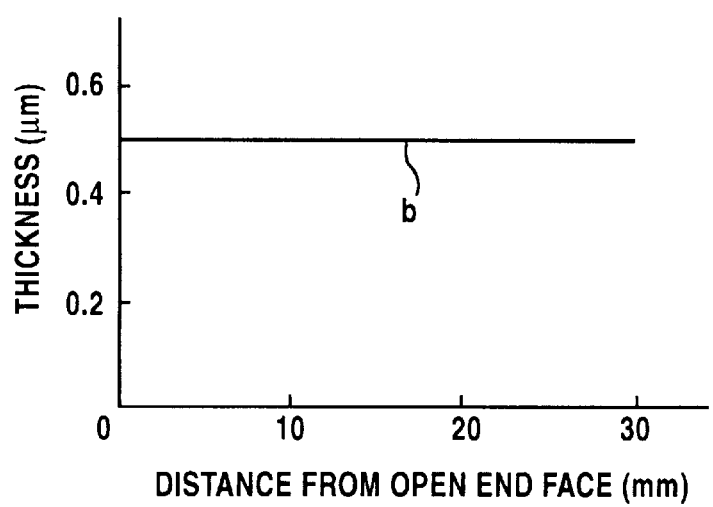
FIG. 4 is a graph showing a thickness distribution in an intermediate film formed over the inner surface of a cylindrical member by an intermediate film forming process in accordance with the present invention.

FIG. 4 shows the thickness distribution of the intermediate film formed by the intermediate film forming process, in which the distance from one open end of the cylindrical member 11 is measured on the horizontal axis, the thickness of the intermediate film formed over the inner surface 11b of the cylindrical member 11 is measured on the vertical axis, and curve b indicates the variation of the thickness.

As shown in FIG. 4, the thickness of the intermediate film at the open end of the cylindrical member 11 is 0.5 µm, the thickness at 30 mm from the open end is substantially the same as the thickness at the open end, and the intermediate film 2 of titanium-silicon alloy is formed in a uniform thickness over the entire inner surface 11b.

The hard carbon film 3 shown in FIG. 1 is formed on the intermediate film 2 formed over the inner surface of the cylindrical member 11. The hard carbon film forming process will be described later.

Figure 5:
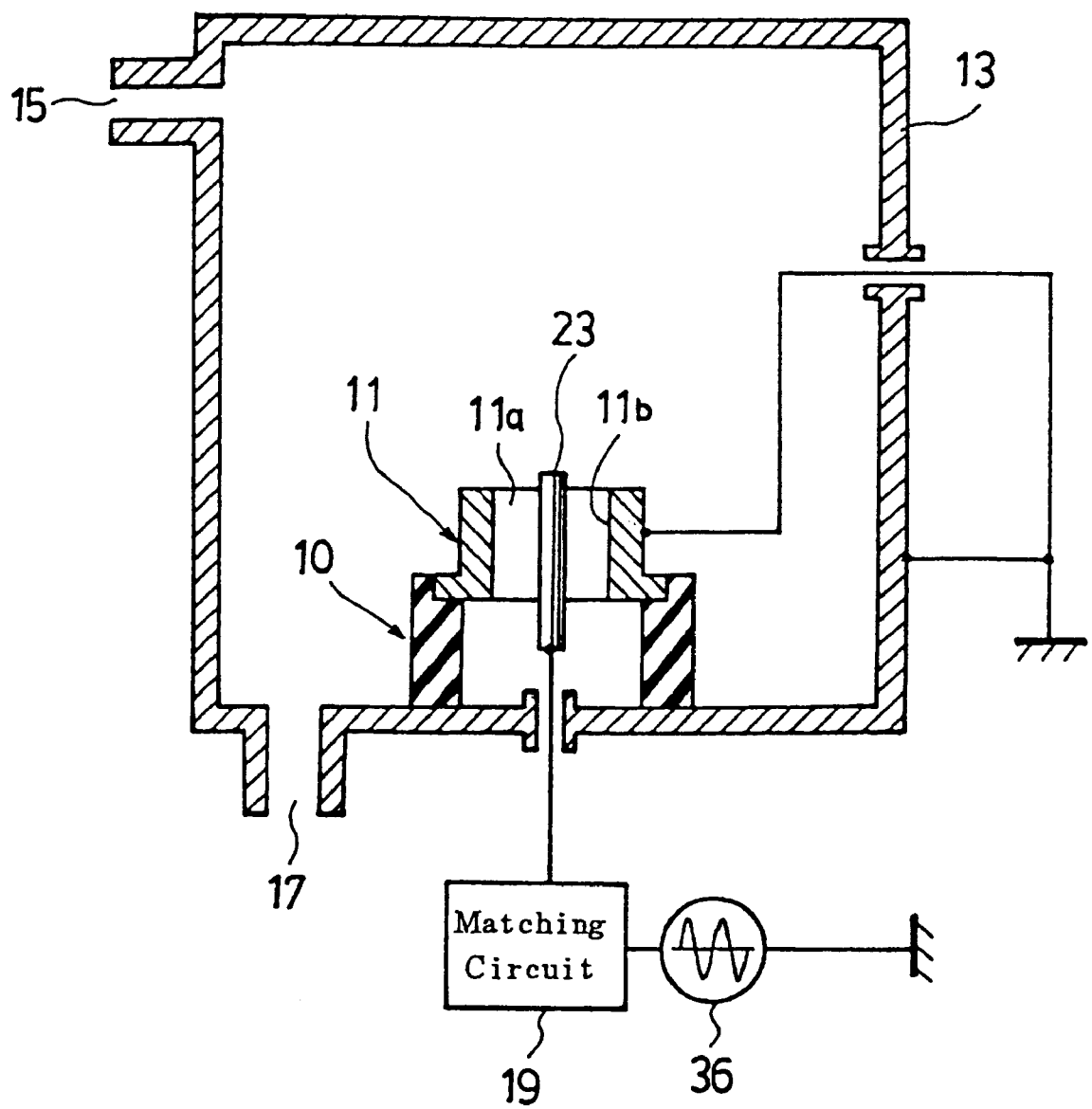
FIGS. 5 and 6 are schematic sectional views for explaining an intermediate film forming process included in a film forming method in another embodiment according to the present invention.

One-Layer Intermediate Film Forming Process in Example 2: FIG. 5

A one-layer intermediate film forming process in Example 2 for forming the one-layer intermediate film over the inner surface of a cylindrical member will be described with reference to FIG. 5, in which parts like or corresponding to those shown in FIG. 3 are designated by the same reference characters and the description thereof will be omitted.

The intermediate film forming process in the second example differs from that in Example 1 previously described with reference to FIG. 3 only in that a high-frequency voltage is applied through a matching circuit 19 to an auxiliary electrode 23 inserted coaxially in the bore 11a of a cylindrical member 11 by a high-frequency power source 36 of, for example, 400 W in power capacity.

A plasma is thus produced around the auxiliary electrode 23 in the bore 11a of the cylindrical member 11, the surface of the auxiliary electrode 23 of a titanium-silicon alloy is bombarded with the ions of the plasma, and molecules of the material for forming the intermediate film are thus sputtered from the surface of the auxiliary electrode 23 and deposited uniformly on the inner surface of the cylindrical member 11.

Thus, the intermediate film of titanium-silicon alloy (metal silicide) can be formed with a uniform thickness as indicated by the curve b in FIG. 4.

Since other conditions, etc., are similar to Example 1, the description thereof will be omitted.

Figure 6:
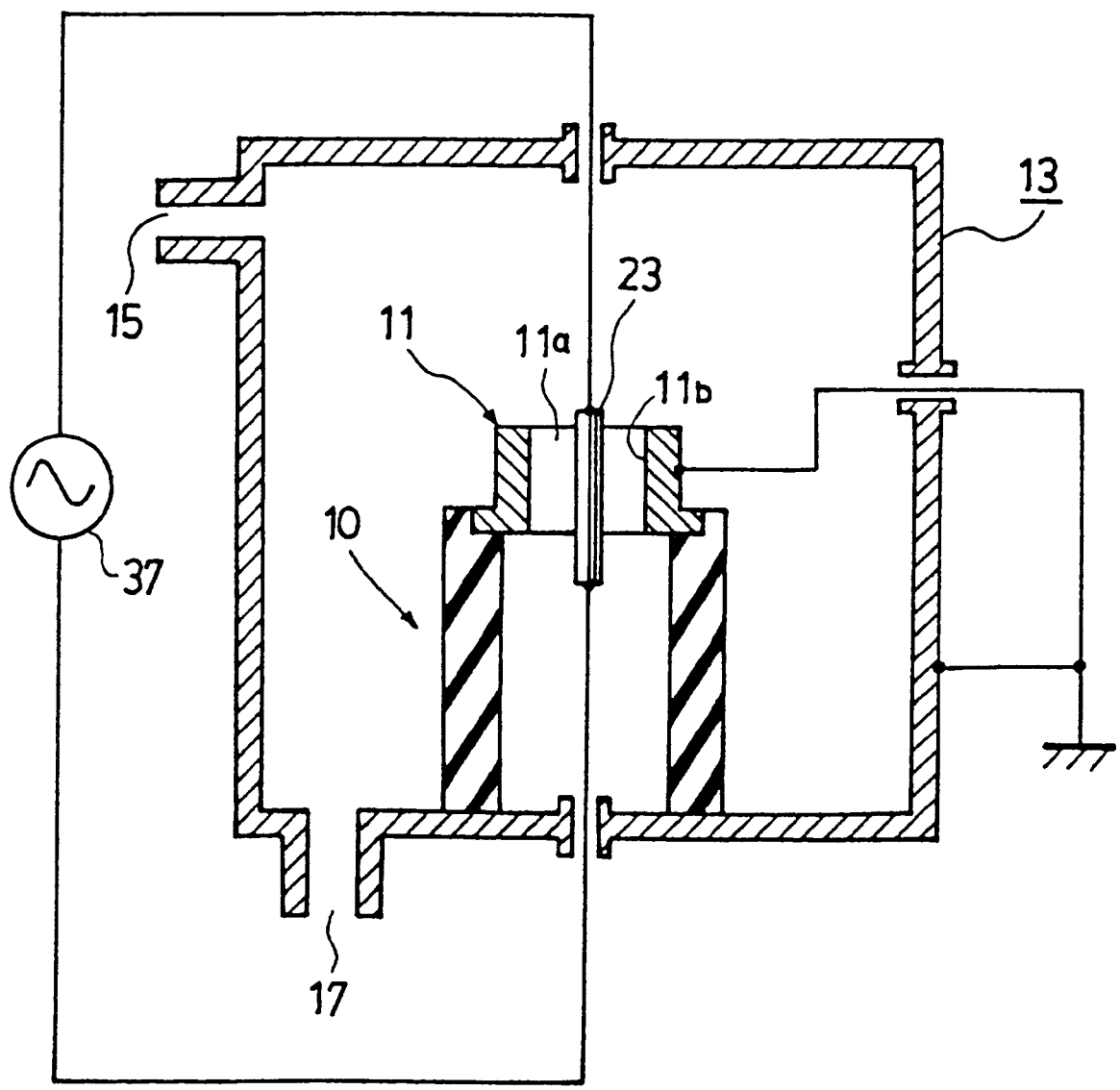

One-Layer Intermediate Film Forming Process in Example 3: FIG. 6

A one-layer intermediate film forming process in Example 3 for forming the one-layer intermediate film over the inner surface of a cylindrical member will be described with reference to FIG. 6, in which parts like or corresponding to those shown in FIG. 3 are also designated by the same reference characters and the description thereof will be omitted.

The intermediate film forming process in the third example differs from that in Example 1 previously described with reference to FIG. 3 only in that the opposite ends of an auxiliary electrode 23, made of a titanium-silicon alloy for the material of the intermediate film, inserted coaxially in the bore 11a of the cylindrical member 11 are connected to an AC power source 37.

After evacuating a vacuum vessel 13 to a vacuum of $3\times10^{-5}$ torr, the AC power source 37 supplies a current of, for example, 2 A to the auxiliary electrode 23 while Ar gas is not supplied into the vacuum vessel 13.

Then, the surface of the auxiliary electrode 23 inserted in the bore 11a of the cylindrical member 11 is melted by resistance heating and molten titanium-silicon alloy evaporates because the vacuum vessel 13 is evacuated to a high vacuum. Thus, the evaporated titanium-silicon molecules are deposited on the inner surface 11b of the cylindrical member 11 by resistance heating evaporation to form the intermediate film of titanium-silicon alloy (metal silicide).

Since the material for forming the intermediate film is caused to evaporate uniformly over the entire length of the bore 11a of the cylindrical member 11 from the surface of the auxiliary electrode 23 by resistance heating, the intermediate film can be formed in a uniform thickness over the entire inner surface 11b of the cylindrical member 11 as shown in FIG. 4.

Since other conditions, etc., are similar to Example 1, the description thereof will be omitted.

Although the auxiliary electrodes 23 employed in these intermediate film forming processes may be of any thickness, as long as the thickness thereof is smaller than the diameter of the bore 11a of the cylindrical member 11, preferably, the auxiliary electrode 23 has a thickness that allows for a space of about 4 mm thickness between the inner surface 11b of the cylindrical member 11 and the auxiliary electrode 23 to secure a sufficient space for producing the plasma therein. Preferably, the auxiliary electrode 23 has a length substantially equal to or slightly greater than the length (axial dimension) of the bore 11a when it is inserted into the bore 11a of the cylindrical member 11.

Although the foregoing embodiments have been described on an assumption that the auxiliary electrode 23 is made of a titanium-silicon alloy and the intermediate film is made of the titanium-silicon alloy, an auxiliary electrode of a carbon-silicon alloy (silicon carbide), a chromium-silicon alloy, a titanium-germanium alloy, a chromium-germanium alloy, an aluminum-silicon alloy or a metal carbide, such as a titanium carbide, may be employed and the intermediate film may be made of such an alloy or such a metal carbide.

Figure 7:
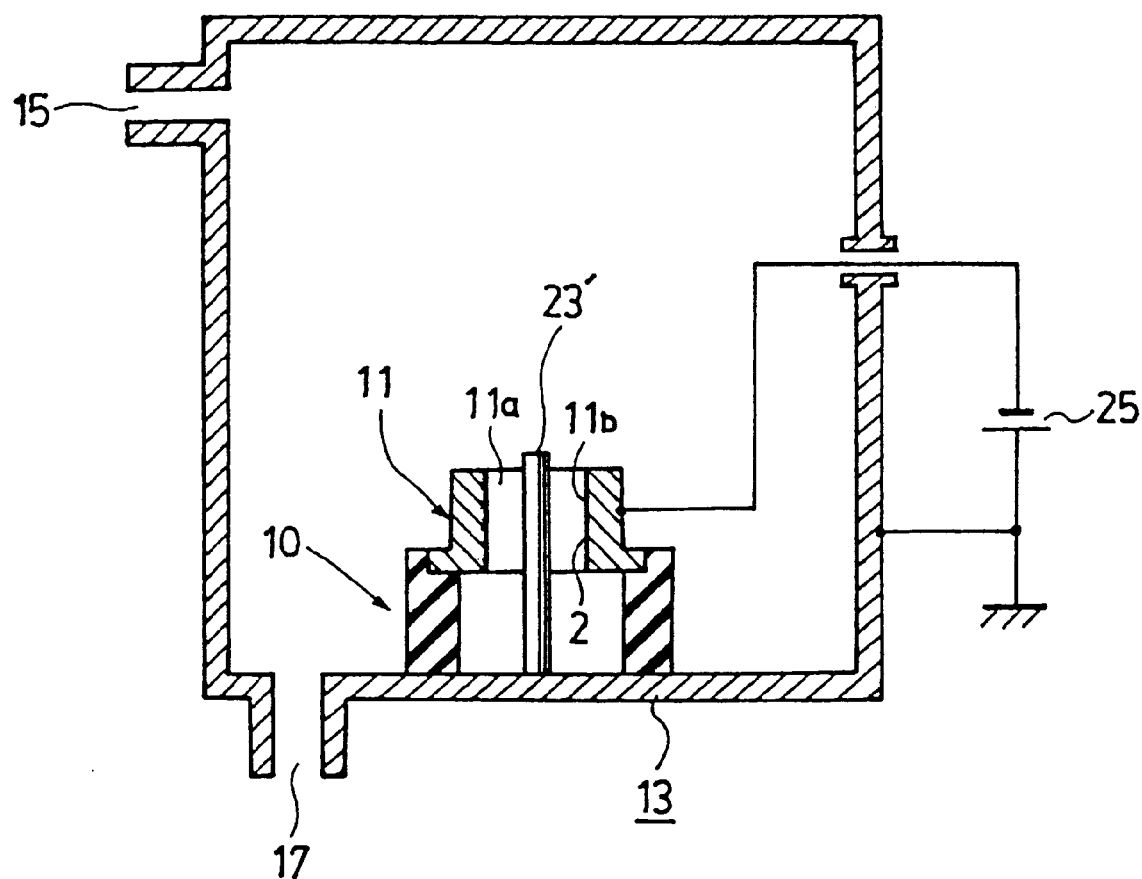
FIGS. 7, 8 and 9 are schematic sectional views for explaining different hard carbon film forming processes included in a film forming method in accordance with the present invention.

Hard Carbon Film Forming Process in Example 1: FIG. 7

The hard carbon film 3 shown in FIG. 1 is formed on the intermediate film 2 formed over the inner surface 11b of the cylindrical member 11 by any one of the foregoing intermediate film forming processes by one of following three hard carbon film forming processes.

A hard carbon film forming process in example 1 will be described with reference to FIG. 7, in which parts corresponding to those shown in FIGS. 3, 5 and 6 are designated by the same reference characters. However, those parts need not necessarily be identical with those shown in FIGS. 3, 5 and 6.

Referring to FIG. 7, the cylindrical member 11 having the inner surface 11b coated with the intermediate film 2 is fixedly mounted on an insulating work support 10 at the lower part thereof in a vacuum vessel 13 provided with a gas inlet port 15 and a gas outlet port 17.

An auxiliary electrode 23' is inserted in the bore 11a of the cylindrical member 11 coaxially with the latter. The auxiliary electrode 23' is connected to the vacuum vessel 13 connected to a ground to keep the auxiliary electrode 23' at a ground potential. The auxiliary electrode 23 used in the intermediate film forming process may be used as the auxiliary electrode 23', or the auxiliary electrode 23' may be a different rod-shaped auxiliary electrode of a metal, such as a stainless steel.

Gases are removed through the gas outlet port 17 to evacuate the vacuum vessel 13 to a vacuum of $3 \times 10^{-5}$ torr by an evacuating means, not shown.

Then, methane gas ($CH_4$ gas), i.e., a gas containing carbon, is supplied through the gas inlet port 15 into the vacuum vessel 13 so that the interior of the vacuum vessel 13 is kept at a vacuum of 0.1 torr.

A DC power source 25 applies −600 V DC to the cylindrical member 11 to produce a plasma in the vacuum vessel 13. Since the auxiliary electrode at the ground potential is inserted in the bore 11a of the cylindrical member 11, the plasma is produced in the bore 11a as well as around the cylindrical member 11. Consequently, a hard carbon film (DLC film) is formed over the entire surface of the cylindrical member 11.

Since the auxiliary electrode 23' is inserted in the bore 11a of the cylindrical member 11 coated with the intermediate film 2 in which equal potentials are opposed to each other during the hard carbon film forming process, hollow discharge, i.e., abnormal discharge, does not occur and the hard carbon film sticks to the intermediate film with an enhanced adhesion.

The potential characteristic of the space in the bore 11a of the cylindrical member 11 is uniform over the entire coaxial length thereof, thus the hard carbon film can be formed with a uniform thickness on the intermediate film 2 coating the inner surface 11b over the entire length of the inner surface 11b.

Moreover, since the intermediate film underlying the hard carbon film is formed with a uniform thickness over the entire inner surface 11b of the cylindrical member 11, the hard carbon film and the intermediate film 2 will not come off.

Accordingly, the hard carbon film 3 sticks to the cylindrical member 11 with a very high adhesion when the intermediate film 2 and the hard carbon film 3 are formed on the inner surface 11b of the cylindrical member 11 by the intermediate film forming process and the hard carbon film forming process in accordance with the present invention.

Although the auxiliary electrodes 23' employed in this hard carbon film forming process may be of any thickness as long as the thickness thereof is smaller than the diameter of the bore 11a of the cylindrical member 11, preferably, the auxiliary electrode 23' has a thickness that allows for a space of about 4 mm thickness between the inner surface 11b of the cylindrical member 11 and the auxiliary electrode 23' to secure a sufficient space for producing the plasma therein. Preferably, the auxiliary electrode 23' has a length substantially equal to the length of the axial dimension of the bore 11a, or protrudes from the cylindrical member 11 when it is inserted into the cylindrical member 11.

Figure 8:
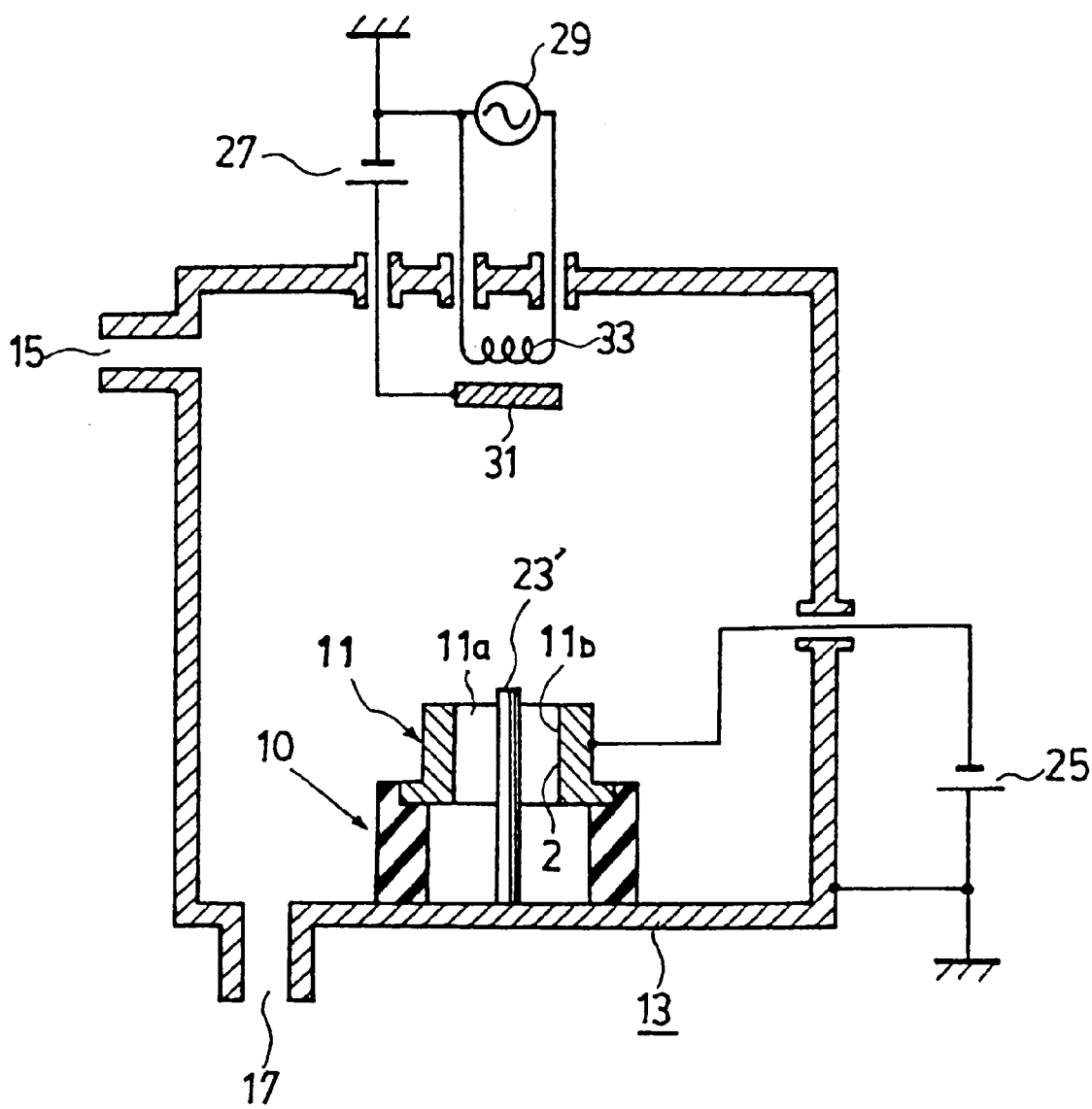

Hard Carbon Film Forming Process in Example 2:
FIG. 8

A hard carbon film forming process in a second example will be described with reference to FIG. 8, in which parts corresponding to those shown in FIGS. 3, 5 and 6 are designated by the same reference characters. However, those parts need not necessarily be identical with those shown in FIGS. 3, 5 and 6.

An anode 31 and a filament 33 are disposed in an upper region of the interior of a vacuum vessel 13 employed in this case.

The cylindrical member 11 having the inner surface 11b coated with the intermediate film 2 is fixedly mounted on an insulating work support 10 disposed on the bottom wall of the vacuum vessel 13 in the same way as the foregoing example. An auxiliary electrode 23' connected to a ground is inserted coaxially in the bore 11a. The auxiliary electrode 23 used in the intermediate film forming process may be used as the auxiliary electrode 23', or the auxiliary electrode 23' may be a different rod-shaped auxiliary electrode of a metal, such as a stainless steel.

The vacuum vessel 13 is evacuated to a vacuum of $3 \times 10^{-5}$ torr. Then, benzene gas ($C_6H_6$ gas), i.e., a gas containing carbon, is supplied through the gas inlet port 15 into the vacuum vessel 13 so that the interior of the vacuum vessel 13 is kept at a vacuum of $5 \times 10^{-3}$ torr.

A DC power source 27 applies +10 V to the anode 31, and an AC power source 29 applies 10 V AC to the filament 33. An AC current of 30 A flows through the filament 33.

A DC power source 25 applies −3 kV to the cylindrical member 11.

Thus, a plasma is produced around the cylindrical member 11 in the vacuum vessel 13 to form a hard carbon film over the entire surface of the cylindrical member 11.

In this case, since the auxiliary electrode 23' of the ground potential is inserted in the bore 11a of the cylindrical member 11, the plasma is produced in the bore 11a as well as around the cylindrical member 11, and thus a hard carbon film is formed over the intermediate film 2 of the inner surface 11b.

Figure 9:
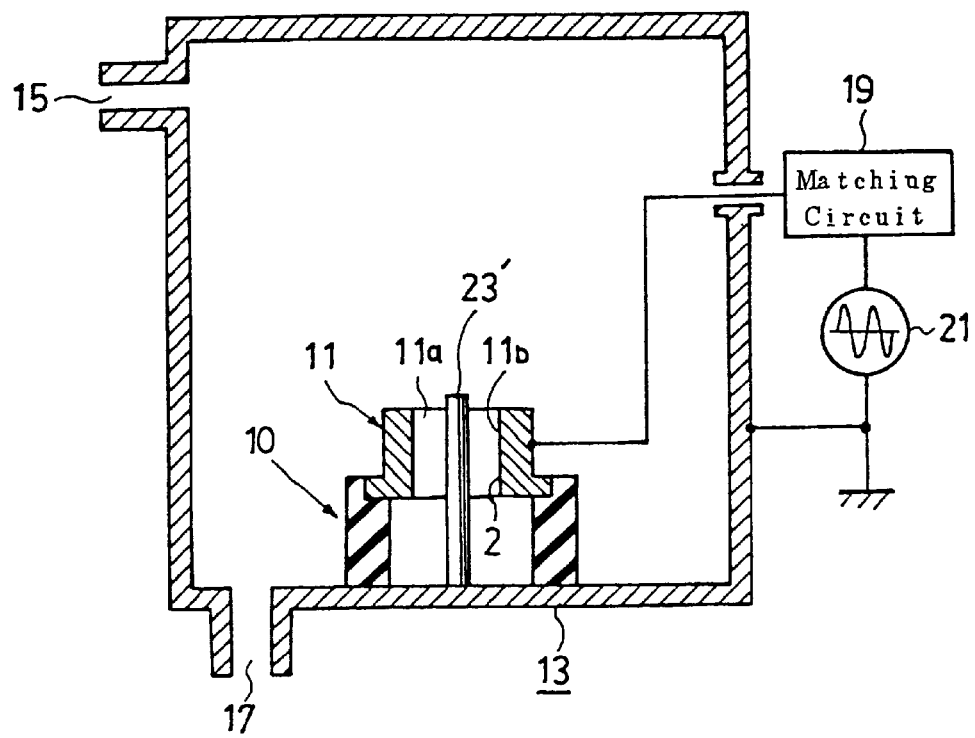
Figure 10:
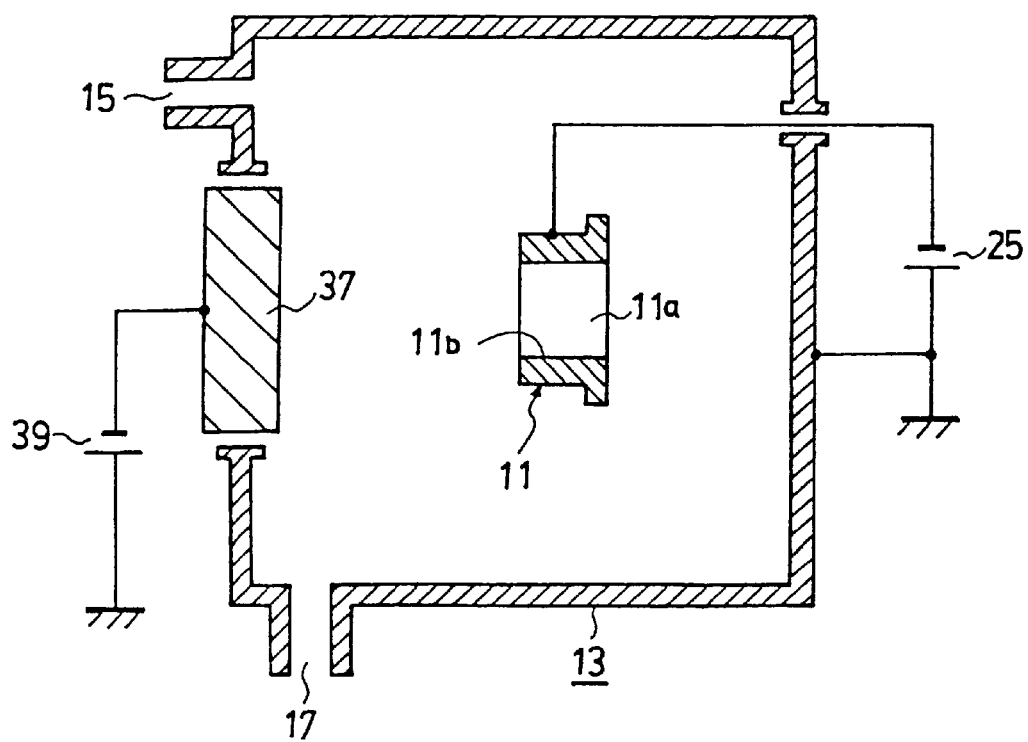
FIG. 10 is a schematic sectional view for explaining a prior art method of forming an intermediate film underlying a hard carbon film.
Figure 11:
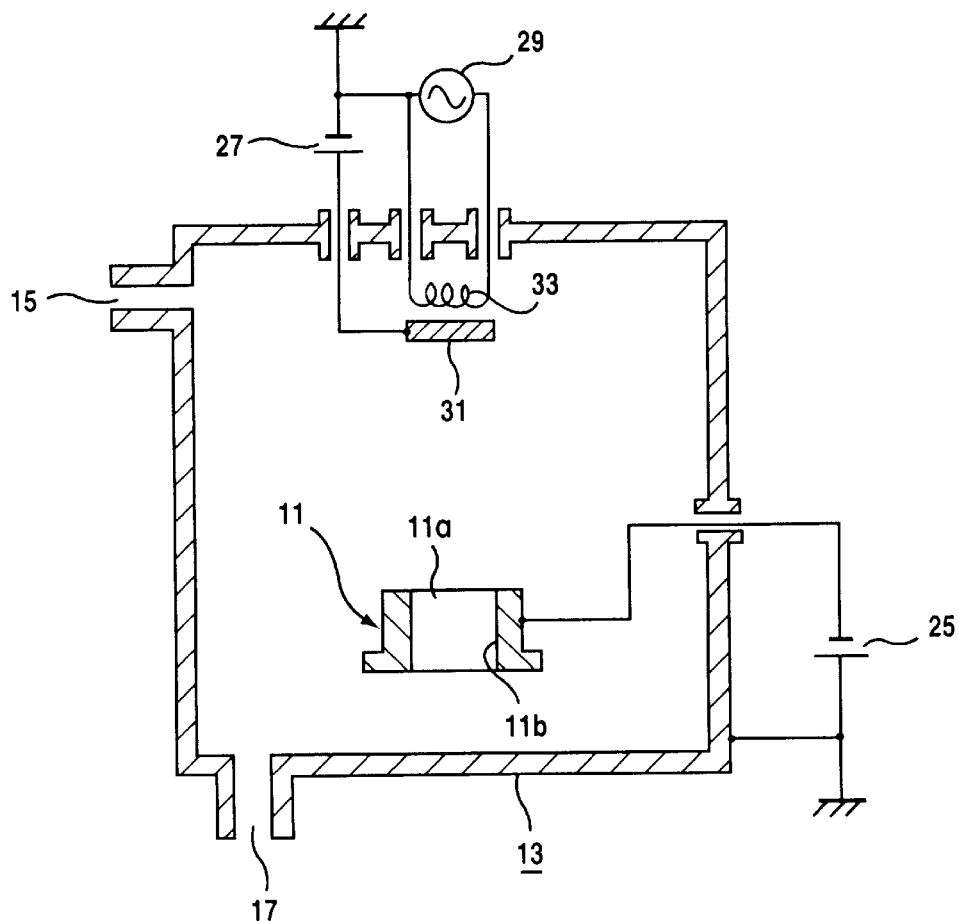
FIG. 11 is a schematic sectional view for explaining a prior art method of forming a hard carbon film.
Figure 12:
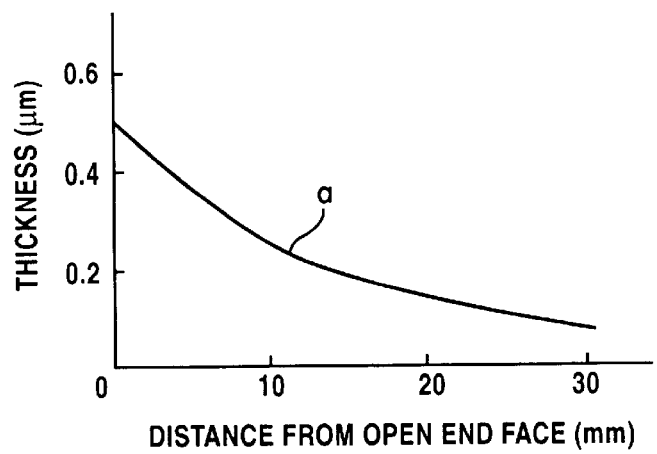
FIG. 12 is a graph showing a thickness distribution in an intermediate film formed over the inner surface of a cylindrical member by a prior art method.

Hard Carbon Film Forming Process in Example 3:
FIG. 9

A hard carbon film forming process in a third example will be described with reference to FIG. 9, in which parts corresponding to those shown in FIGS. 3, 5 and 6 are designated by the same reference characters. However, those parts need not necessarily be identical with those shown in FIGS. 3, 5 and 6.

As shown in FIG. 9, the cylindrical member 11 having the inner surface 11b coated with the intermediate film 2 is fixedly mounted on an insulating work support 10 disposed on the bottom wall of the vacuum vessel 13. An auxiliary electrode 23' connected to a ground is inserted coaxially in the bore 11a. The auxiliary electrode 23 used in the intermediate film forming process may be used as the auxiliary electrode 23' or the auxiliary electrode 23' may be a different rod-shaped auxiliary electrode of a metal, such as a stainless steel.

The vacuum vessel 13 is evacuated to a vacuum of $3×10^{-5}$ torr. Then, methane gas ($CH_4$ gas), i.e., a gas containing carbon, is supplied through the gas inlet port 15 into the vacuum vessel 13 so that the interior of the vacuum vessel 13 is kept at a vacuum of 0.1 torr.

A high-frequency power source 21 of 13.56 MHz oscillation frequency applies a high-frequency voltage (high frequency power of 400 W) through a matching circuit 19 to the cylindrical member 11 to produce a plasma around the cylindrical member 11 in the vacuum vessel 13 to form a hard carbon film over the entire surface of the cylindrical member 11.

Since in this case the auxiliary electrode 23' of the ground potential is also inserted in the bore 11a of the cylindrical member 11, the plasma is produced in the bore 11a as well as around the cylindrical member 11 and, consequently, the hard carbon film is also formed on the intermediate film 2 formed over the inner surface 11b.

In this embodiment also, since the auxiliary electrode 23' is inserted in the bore 11a of the cylindrical member 11 coated with the intermediate film 2 in which equal potentials are opposed to each other during the hard carbon film forming process, hollow discharge, i.e., abnormal discharge, does not occur and the hard carbon film 3 sticking to the intermediate film 2 with an enhanced adhesion can be formed. The hard carbon film 3 can be formed with a uniform thickness over the entire inner surface 11b from the open end to the depth of the bore 11a of the cylindrical member 11.

Example 3 is the same in other conditions, functions and effects as Example 1, and hence further description of Example 3 will be omitted.

The hard carbon film forming process and the intermediate film forming process may be carried out in separate vacuum vessels or may be carried out in one vacuum vessel. The intermediate film forming process and the hard carbon forming process may be carried out continuously in one vacuum vessel.

Preferably, the intermediate film and the hard carbon film are formed continuously by a film forming apparatus, because the adhesion between the intermediate film 2 formed over the inner surface of the cylindrical member and the hard carbon film is enhanced.

When forming the intermediate film and the hard carbon film continuously by one film forming apparatus, the auxiliary electrode 23 is connected to ground after the intermediate film has been formed, a negative DC voltage or a high-frequency voltage is applied to the cylindrical member 11, and a gas containing carbon is supplied through the gas inlet port 15 into the vacuum vessel.

Although the hard carbon film forming processes described with reference to FIGS. 7 to 9 use methane gas or benzene gas as a gas containing carbon, a gas containing carbon other than methane gas and benzene gas, such as ethane gas, or a vapor of a liquid containing carbon, such as hexane, may be used.

These three modes of intermediate film forming processes and these three modes of hard carbon film forming processes may be used in any one of nine possible combinations.

Actual values mentioned in the foregoing description of the embodiments are only examples; those values are subject to variation according to the materials, shapes and dimensions of the cylindrical member and the auxiliary electrodes.

Since the hard carbon film forming processes described with reference to FIGS. 7 to 9 form a plasma around the cylindrical member 11 and in the bore 11a thereof, the hard carbon film 3 is formed over both the outer and the inner surface of the cylindrical member 11.

However, it is possible to form the hard carbon film 3 only over the inner surface 11b by coating the outer surface of the cylindrical member 11 with a coating material; simply, by wrapping aluminum foil around the outer surface of the cylindrical member 11.

The auxiliary electrode 23' inserted in the bore 11a of the cylindrical member 11 may be connected to the positive electrode of a DC power source instead of being connected to ground to keep the same at a ground potential during the hard carbon forming process.

The application of a positive DC voltage to the auxiliary electrode 23' during the hard carbon film forming process provides the following effects.

When a positive DC voltage is applied to the auxiliary electrode 23', electrons collect around the auxiliary electrode 23' in a high electron density. Consequently, the probability of collisions between molecules containing carbon and electrons increases necessarily and thereby the ionization of gas molecules is promoted, so the plasma density around the auxiliary electrode 23' increases.

Therefore, when a positive DC voltage is applied to the auxiliary electrode 23', a hard carbon film is deposited at a deposition rate higher than that at which a hard carbon film is deposited with the auxiliary electrode 23' kept at the ground potential.

When the diameter of the bore 11a of the cylindrical member 11 is small and only a space of a small size is secured around the auxiliary electrode 23', no plasma can be produced in the bore 11a of the cylindrical member 11 and no hard carbon film can be formed if no positive DC voltage is applied to the auxiliary electrode 23'.

When a positive DC voltage is applied to the auxiliary electrode 23' when forming a hard carbon film, electrons can forcibly be collected around the auxiliary electrode 23' by the positive DC voltage applied to the auxiliary electrode 23' inserted in the bore 11a of the cylindrical member 11. Consequently, a plasma can be produced around the auxiliary electrode 23' and a hard carbon film can be formed over the inner surface 11b of the cylindrical member 11 even if the diameter of the bore 11a is small.

Although the intermediate film forming process keeps the cylindrical member 11 at a ground potential, a negative DC voltage may be applied to the cylindrical member 11. When the cylindrical member 11 is made of an insulating material, such as a ceramic material, an intermediate film of a material forming the auxiliary electrode 23 can be formed with a uniform thickness over the inner surface of the cylindrical member 11 even if the cylindrical member 11 is not grounded, no negative DC voltage is applied to the cylindrical member 11 and the cylindrical member 11 is kept at a floating potential.

Two-Layer Intermediate Film Forming Process in Example 1: FIG. 3

A two-layer intermediate film forming process in Example 1 among three modes of two-layer intermediate film forming processes for forming the two-layer intermediate film 12 having a first intermediate film 12a and a second intermediate film 12b as shown in FIG. 2 over the inner surface 11b of the cylindrical member 11 will be described hereinafter with reference to FIG. 3 again.

Referring to FIG. 3, the cylindrical member 11 having a bore 11a is fixedly mounted on an insulating work support 10 fixed to the bottom of a vacuum vessel 13 provided with a gas outlet port 17 and a gas inlet port 15. A first auxiliary electrode of a material for forming the first intermediate film, such as titanium or chromium, is inserted, similarly to the auxiliary electrode 23 shown in FIG. 3, in the center of the center bore 11a of the cylindrical member 11. The cylindrical member 11 and the vacuum vessel 13 are grounded to keep the same at a ground potential.

Gases are removed through the gas outlet port 17 from the vacuum vessel 13 to evacuate the vacuum vessel 13 to a vacuum of $3 \times 10^{-5}$ torr. Then, Ar gas, i.e., a sputtering gas, is supplied through the gas inlet port 15 into the vacuum vessel 13 so that the interior of the vacuum vessel 13 is kept at a vacuum of $5 \times 10^{-3}$ torr.

A DC power source 35 applies −500 V DC to the first auxiliary electrode to produce a plasma around the first auxiliary electrode in the bore 11a of the cylindrical member 11. The surface of the first auxiliary electrode 23 of a material for forming the first intermediate film is bombarded with the ions of the plasma.

The first auxiliary electrode thus bombarded with the ions sputters molecules of the first intermediate film forming material, and the molecules are deposited on the inner surface 11b of the cylindrical member 11 to form the first intermediate film 12a of a metal capable of sticking to the cylindrical member 11 with high adhesion, such as chromium or titanium.

Then, the first auxiliary electrode is removed and a second auxiliary electrode of a material for forming the second intermediate film, such as silicon or germanium, is inserted, similarly to the auxiliary electrode 23, in the center of the bore 11a of the cylindrical member 11.

Then, the DC power source 35 applies a negative DC voltage to the second auxiliary electrode to produce a plasma around the second auxiliary electrode in the bore 11a of the cylindrical member 11. The surface of the second auxiliary electrode is bombarded with the ions of the plasma. The second auxiliary electrode thus bombarded with the ions sputters molecules of the second intermediate film forming material, and the molecules are deposited on the first intermediate film 12a to form the second intermediate film 12b of a material having good bonding affinity with the hard carbon film, such as silicon or germanium.

The first intermediate film 12a and the second intermediate film 12b shown in FIG. 2 are formed with a uniform thickness over the entire inner surface 11b of the cylindrical member 11 from the open end to the depth of the inner surface 11b of the cylindrical member 11.

Titanium, chromium or aluminum forming the first intermediate film 12a of the two-layer intermediate film 12 secures a high adhesion between the first intermediate film 12a and the cylindrical member 11, and silicon or germanium forming the second intermediate film 12b of the same forms a strong covalent bond with the hard carbon film 3.

Two-Layer Intermediate Film Forming Process in Example 2: FIG. 5

A two-layer intermediate film forming process in Example 2 is similar to that in Example 1. However, in the same way as the one-layer intermediate film forming process in Example 2 described before, a first auxiliary electrode of a material for forming the first intermediate film, such as titanium or chromium, is inserted, similarly to the auxiliary electrode 23 shown in FIG. 5, in the center of the center bore 11a of the cylindrical member 11 connected to a ground. Then, a vacuum vessel 13 is evacuated, Ar gas, i.e., sputtering gas, is supplied into the vacuum vessel 13, and a high-frequency voltage is applied through a matching circuit 19 to the first auxiliary electrode to produce a plasma around the first auxiliary electrode by a high-frequency power source 36. The surface of the first auxiliary electrode is bombarded with ions of the plasma, the first intermediate film forming material forming the first auxiliary electrode is sputtered and the first intermediate film 12a is deposited with a uniform thickness over the inner surface 11b of the cylindrical member 11.

Subsequently, the first auxiliary electrode inserted in the bore 11a of the cylindrical member 11 is replaced with a second auxiliary electrode of a second intermediate film forming material, such as silicon or germanium, the high-frequency power source 36 applies a high-frequency voltage through the matching circuit 19 to the second auxiliary electrode to produce a plasma around the second auxiliary electrode. The surface of the second auxiliary electrode is bombarded with ions of the plasma, the first intermediate film forming material forming the second auxiliary electrode is sputtered and the second intermediate film 12b is deposited with a uniform thickness on the first intermediate film 12a.

Example 2 is the same in other conditions, functions and effects as the one-layer intermediate film forming process in Example 2 and the two-layer intermediate film forming process in Example 1, and hence further description of Example 2 will be omitted.

Two-Layer Intermediate Film Forming Process in Example 3: FIG. 6

A two-layer intermediate film forming process in Example 3 is similar to that in Example 1. A first auxiliary electrode of a first intermediate film forming material, such as titanium or chromium, is inserted in the center of the bore 11a of the cylindrical member 11 connected to a ground instead of the auxiliary electrode 23 shown in FIG. 6.

A vacuum vessel 13 is evacuated, an AC power source 37 applies an AC voltage to the first auxiliary electrode to evaporate the first intermediate film forming material forming the first auxiliary electrode by resistance heating. The first intermediate film 12a of titanium or chromium having high adhesion with the cylindrical member is deposited over the inner surface 11b of the cylindrical member 11.

Subsequently, the first auxiliary electrode is replaced with a second auxiliary electrode of a second intermediate film forming material, such as silicon or germanium. An AC voltage is applied to the second auxiliary electrode to evaporate the second intermediate film forming material forming the second auxiliary electrode by resistance heating. The second intermediate film 12b of silicon or germanium having high adhesion with the hard carbon film 3 is deposited on the first intermediate film 12a.

Example 3 is the same in other conditions, functions and effects as the one-layer intermediate film forming process in Example 3 and the two-layer intermediate film forming process in Example 1, and hence further description of Example 2 will be omitted.

In these intermediate film forming processes, the first auxiliary electrode may be made of titanium, chromium, aluminum, a titanium alloy, a chromium alloy or an aluminum alloy, and the second auxiliary electrode may be made of silicon, germanium, a silicon compound or a germanium compound.

The carbon film 3 shown in FIG. 2 is formed on the two-layer intermediate film 12 formed over the inner surface 11b of the cylindrical member 11 by any one of the hard carbon film forming processes in Examples 1, 2 and 3 after the completion of any one of the two-layer intermediate film forming processes in Examples 1, 2 and 3.

The hard carbon film forming process may be carried out in a vacuum vessel other than that used for carrying out the two-layer intermediate film forming process, or the two-layer intermediate film forming process and the hard carbon film forming process may continuously be carried out in one vacuum vessel. Preferably, the two-layer intermediate film forming process and the hard carbon forming process are carried out continuously in one vacuum vessel.

One-layer Intermediate Film Forming Process in Example 4: FIG. 3

Six examples of one-layer intermediate film forming processes different from the foregoing one-layer intermediate film forming processes will be described hereinafter. These six examples form an intermediate film of a silicon compound by using an intermediate film forming material forming an auxiliary electrode, and carbon or a compound of silicon and carbon contained in a gas supplied into a vacuum vessel.

A one-layer intermediate film forming process in Example 4, similarly to Example 1, uses the apparatus shown in FIG. 3.

Referring to FIG. 3, a cylindrical member 11 having a bore 11a is fixedly mounted on the insulating work support 10 in the vacuum vessel 13 provided with the gas inlet port 15 and the gas outlet port 17. A rod-shaped auxiliary electrode 23 (made of a material different from that of the auxiliary electrode 23 employed in Example 1) of titanium, i.e., an intermediate film forming material, is inserted in the bore 11a of the cylindrical member 11 coaxially with the latter. The cylindrical member 11 and the vacuum vessel 13 are grounded to keep the same at a ground potential.

Gases are removed from the vacuum vessel 13 through the gas outlet port 17 to evacuate the vacuum vessel 13 to a vacuum of $3\times10^{-5}$ torr or below. Subsequently, a mixed gas containing Ar gas, i.e., a sputtering gas, and methane gas ($CH_4$ gas), i.e., a gas containing carbon, is supplied through the gas inlet port 15 into the vacuum vessel 13 so that the interior of the vacuum vessel 13 is kept at a vacuum of $8\times10^{-3}$ torr.

The methane concentration of the mixed gas is 40% to 80% by weight.

The DC power source 35 applies −500 V DC to the auxiliary electrode 23 to produce a plasma around the auxiliary electrode 23 in the bore 11a of the cylindrical member 11. A negative DC voltage of about −50 V DC may be applied to the cylindrical member 11 instead of grounding the cylindrical member 11.

The surface of the auxiliary electrode 23 of titanium is bombarded with ions of the plasma and the auxiliary electrode 23 sputters titanium molecules. The titanium molecules thus sputtered react with carbon contained in the methane gas and the intermediate film of a titanium carbide (TiCx) is deposited over the inner surface 11b of the cylindrical member 11 by reactive sputtering.

This sputtering process is continued for 30 minutes to form the intermediate film 2 (refer to FIG. 1) of titanium carbide having a uniform thickness of 0.5 μm over the inner surface 11b of the cylindrical member 11.

Example 4 is the same in other conditions, functions and effects as the one-layer intermediate film forming process in Example 1, and hence further description of Example 4 will be omitted.

One-Layer Intermediate Film Forming Process in Example 5: FIG. 3

A one-layer intermediate film forming process in Example 5 differs from that in Example 4 in gas supplied into the vacuum vessel 13.

The one-layer intermediate film forming process in Example 5 uses the apparatus shown in FIG. 3 and uses, similarly to Example 4, an auxiliary electrode 23 of titanium (Ti) inserted in the bore 11a of a cylindrical member 11 disposed in the vacuum vessel 13.

The vacuum vessel 13 is evacuated to a vacuum of $3\times10^{-5}$ torr or below. Subsequently, a mixed gas of Ar gas, i.e., a sputtering gas, and monosilane ($SiH_4$) gas, i.e., a gas containing silicon (Si) is supplied through the gas inlet port 15 into the vacuum vessel 13 so that the interior of the vacuum vessel 13 is kept at a vacuum of $8\times10^{-3}$ torr.

Subsequently, the DC power source 35 applies −500 V DC to the auxiliary electrode 23 to produce a plasma around the auxiliary electrode 23. The surface of the auxiliary electrode 23 of titanium is bombarded with ions of the plasma and the auxiliary electrode 23 sputters titanium molecules. The titanium molecules thus sputtered react with silicon contained in the monosilane and the intermediate film of a titanium suicide (TiSi) is deposited over the inner surface 11b of the cylindrical member 11 by reactive sputtering.

This sputtering process is continued for 30 minutes to form the intermediate film 2 (refer to FIG. 1) of titanium silicide having a uniform thickness of 0.5 μm over the inner surface 11b of the cylindrical member 11.

Example 5 is the same in other conditions, functions and effects as the one-layer intermediate film forming process in Example 1, and hence further description of Example 5 will be omitted.

One-Layer Intermediate Film Forming Process in Example 6: FIG. 5

A one-layer intermediate film forming process in Example 6, similarly to that in Example 2, uses the apparatus shown in FIG. 5.

An auxiliary electrode 23 of titanium (Ti), similarly to that employed in Example 4, is inserted in the bore 11a of a cylindrical member 11 placed in the vacuum vessel 13.

The vacuum vessel 13 is evacuated to a vacuum of $3\times10^{-5}$ torr or below. Subsequently, a mixed gas of Ar gas, i.e., a sputtering gas, and methane gas ($CH_4$ gas), i.e., a gas containing carbon, is supplied through the gas inlet port 15 into the vacuum vessel 13 so that the interior of the vacuum vessel 13 is kept at a vacuum of $8\times10^{-3}$ torr.

Subsequently, the high-frequency power source 36 of 13.56 MHz oscillation frequency applies a high-frequency voltage (400 W in power) through the matching circuit 19 to the auxiliary electrode 23 to produce a plasma around the auxiliary electrode 23.

The surface of the auxiliary electrode 23 of titanium is bombarded with ions of the plasma and the auxiliary electrode 23 sputters titanium molecules. The titanium molecules thus sputtered react with carbon contained in the methane and the intermediate film of a titanium carbide ($TiC_x$) is deposited over the inner surface 11b of the cylindrical member 11 with a uniform thickness by reactive sputtering.

Example 6 is the same in other conditions, functions and effects as the one-layer intermediate film forming process in Example 2, and hence further description of Example 6 will be omitted.

One-Layer Intermediate Film Forming Process in Example 7: FIG. 5

A one-layer intermediate film forming process in Example 7 uses a gas different from that used by the one-layer intermediate film forming process in Example 6.

The one-layer intermediate film forming process in Example 7 uses the apparatus shown in FIG. 5. A cylindrical member 11 and an auxiliary electrode 23 of titanium (Ti) are placed in the vacuum vessel 13.

The vacuum vessel 13 is evacuated in a mode similar to that in Example 5 and a mixed gas of Ar gas and monosilane gas ($SiH_4$ gas) which is containing silicon (Si) is supplied into the vacuum vessel 13.

Subsequently, the high-frequency power source 36 applies a high-frequency voltage through the matching circuit 19 to the auxiliary electrode 23 to produce a plasma around the auxiliary electrode 23.

The surface of the auxiliary electrode 23 of titanium is bombarded with ions of the plasma and the auxiliary electrode 23 sputters titanium molecules. The titanium molecules thus sputtered react with silicon in the monosilane gas and the intermediate film of a titanium silicide (TiSi) is deposited over the inner surface 11b of the cylindrical member 11 with a uniform thickness by reactive sputtering.

Example 7 is the same in other conditions, functions and effects as the one-layer intermediate film forming processes in Examples 2 and 5, and hence further description of Example 7 will be omitted.

One-Layer Intermediate Film Forming Process in Example 8: FIG. 6

A one-layer intermediate film forming process in Example 8 uses, similarly to Example 3, the apparatus shown in FIG. 6.

A cylindrical member 11 is placed, similarly to the cylindrical member 11 used in Example 4, in the vacuum vessel 13, and an auxiliary electrode 23 of titanium (Ti) is inserted in the bore 11a of the cylindrical member 11.

The vacuum vessel 13 is evacuated and a mixed gas of Ar gas and methane gas ($CH_4$ gas), i.e., a gas containing carbon, is supplied into the vacuum vessel 13.

Subsequently, the AC power source 37 applies an AC voltage to the auxiliary electrode 23 so that a current of 10 A flows through the auxiliary electrode 23. Consequently, the surface of the auxiliary electrode 23 of titanium inserted in the bore 11a of the cylindrical member 11 is melted by heat generated by the auxiliary electrode 23 by resistance heating and titanium evaporates.

A titanium vapor thus produced reacts with carbon contained in the methane gas and the intermediate film of titanium carbide is deposited over the inner surface 11b of the cylindrical member 11 by evaporation; that is, the intermediate film of titanium carbide (metal carbide) is formed over the inner surface 11b of the cylindrical member 11 by a resistance heating evaporation process.

Example 8 is the same in other conditions, functions and effects as the one-layer intermediate film forming processes in Examples 3 and 5, and hence further description of Example 8 will be omitted.

One-Layer Intermediate Film Forming Process in Example 9: FIG. 6

A one-layer intermediate film forming process in Example 9 uses a gas different from that used by Example 8.

The one-layer intermediate film forming process in Example 9 uses the apparatus shown in FIG. 6, and a cylindrical member 11, similarly to that used in Example 6, is placed in the vacuum vessel 13, and an auxiliary electrode 23 of titanium is inserted in the bore 11a of the cylindrical member 11.

The vacuum vessel 13 is evacuated similarly in the Example 5 and a mixed gas containin Ar gas and monosilane ($SiH_4$) gas which is a gas containing silicon, is supplied into the vacuum vessel 13.

Subsequently, the AC power source 37 applies an AC voltage to the auxiliary electrode 23 so that a current of 10 A flows through the auxiliary electrode 23, similar to Example 8. Consequently, the surface of the auxiliary electrode 23 of titanium inserted in the bore 11a of the cylindrical member 11 is melted by heat generated by the auxiliary electrode 23 by resistance heating and titanium evaporates. A titanium vapor thus produced reacts with silicon in the monosilane gas and the intermediate film of titanium silicide (TiSi) is deposited over the inner surface 11b of the cylindrical member 11 with a uniform thickness by a resistance heating evaporation process.

Example 9 is the same in other conditions, functions and effects as the one-layer intermediate film forming processes in Examples 3 and 5, and hence further description of Example 8 will be omitted.

Two-Layer Intermediate Film Forming Process in Example 4: FIG. 3

Six examples of two-layer intermediate film forming processes different from the foregoing two-layer intermediate film forming processes will be described hereinafter. These six examples form the first intermediate film of a material forming an auxiliary electrode, and form the second intermediate film of a compound of the material forming the auxiliary electrode and carbon or silicon contained in a gas supplied into the vacuum vessel.

A two-layer intermediate film forming process in Example 4 will be described.

A two-layer intermediate film forming process in Example 4, similarly to the two-layer intermediate film forming process in Example 1, uses the apparatus shown in FIG. 3, and forms the first intermediate film 12a of titanium and the second intermediate film 12b of titanium carbide, i.e., a compound of titanium and carbon.

Referring to FIG. 3, a cylindrical member 11 having a bore 11a is fixedly mounted on the insulating work support 10 in the vacuum vessel 13 provided with the gas inlet port 15 and the gas outlet port 17. An auxiliary electrode 23 of titanium, i.e., an intermediate film forming material, is inserted in the center of the bore 11a of the cylindrical member 11.

The cylindrical member 11 and the vacuum vessel 13 are grounded to keep the same at a ground potential. A negative DC voltage of about −500 V DC may be applied to the cylindrical member 11.

Gases are removed from the vacuum vessel 13 through the gas outlet port 17 to evacuate the vacuum vessel 13 to a vacuum of $3 \times 10^{-5}$ torr or below. Subsequently, Ar gas, i.e., a sputtering gas, is supplied through the gas inlet port 15 into the vacuum vessel 13 so that the interior of the vacuum vessel 13 is kept at a vacuum of $8 \times 10^{-3}$ torr.

The DC power source 35 applies −500 V DC to the auxiliary electrode 23 to produce a plasma around the auxiliary electrode 23 in the bore 11a of the cylindrical member 11.

The surface of the auxiliary electrode 23 of titanium is bombarded with ions of the plasma and the auxiliary electrode 23 sputters titanium molecules. The titanium molecules thus sputtered are deposited on the inner surface 11b of the cylindrical member 11 to form the first intermediate film of titanium.

This sputtering process is continued for 30 minutes to form the first intermediate film 12a (refer to FIG. 2) of titanium having a uniform thickness of 0.5 μm.

A second intermediate film forming process for forming the second intermediate film 12b on the first intermediate film 12a will be described hereinafter. This second intermediate film forming process may be carried out in another vacuum vessel, but, preferably, the first intermediate film forming process and the second intermediate film forming process are carried out continuously in the same vacuum vessel 13.

When the first intermediate film forming process and the second intermediate film forming process are carried out continuously in the vacuum vessel 13 of FIG. 3, a mixed gas of Ar gas, i.e., a sputtering gas, and methane gas ($CH_4$ gas), i.e., a gas containing carbon, is supplied through the gas inlet port 15 into the vacuum vessel 13 so that the interior of the vacuum vessel 13 is kept at a vacuum of $8 \times 10^{-3}$ torr. The methane concentration of the mixed gas is 40% to 80% by weight.

Subsequently, the DC power source 35a applies −500 V DC to the auxiliary electrode 23 of titanium used for forming the first intermediate film 12a to produce a plasma around the auxiliary electrode 23 inserted in the bore 11a of the cylindrical member 11.

The surface of the auxiliary electrode 23 of titanium is bombarded with ions of the plasma and the auxiliary electrode 23 sputters titanium molecules. The titanium molecules thus sputtered react with carbon contained in the methane gas and form the second intermediate film of a titanium carbide ($TiC_x$).

The sputtering process is continued for 30 minutes to form the second intermediate film 12b of titanium carbide having a uniform thickness of 0.5 μm on the first intermediate film 12a formed over the inner surface 11b of the cylindrical member 11.

Example 4 is the same in other conditions, functions and effects as the two-layer intermediate film forming process in Example 1, and hence further description of Example 4 will be omitted.

Two-Layer Intermediate Film Forming Process in Example 5: FIG. 3

Example 5 differs from Example 4 in that Example 5 forms the second intermediate film of a metal silicide instead of a metal carbide.

The two-layer intermediate film forming process uses the apparatus of FIG. 3, and forms the first intermediate film 12a by the same process as that carried out in Example 4.

After forming the first intermediate film over an inner surface 11b of a cylindrical member 11, a mixed gas of Ar gas, i.e., a sputtering gas, and monosilane gas which is a gas containing silicon, i.e., a monosilane, is supplied through the gas inlet port 15 into the vacuum vessel 13.

The DC power source 35a applies −500 V DC to the auxiliary electrode 23 to produce a plasma around the auxiliary electrode 23 inserted in the bore 11a of the cylindrical member 11.

The surface of the auxiliary electrode 23 of titanium is bombarded with ions of the plasma and the auxiliary electrode 23 sputters titanium molecules. The titanium molecules thus sputtered react with silicon in the monosilane gas and the second intermediate film of a titanium suicide (TiSi) is deposited on the first intermediate film in a uniform thickness by reactive sputtering.

Example 5 is the same in other conditions, functions and effects as the two-layer intermediate film forming process in Example 1 and 4, and hence further description of Example 5 will be omitted.

Two-Layer Intermediate Film Forming Process in Example 6: FIG. 5

A two-layer intermediate film forming process, similarly to the one-layer intermediate film forming process in Example 2, uses the apparatus shown in FIG. 5. Example 6 differs from Example 4 only in that a plasma is produced around an auxiliary electrode of titanium, i.e., an intermediate film forming material, inserted in the bore 11a of a cylindrical member 11 by applying a high-frequency voltage (400 W in power) through a matching circuit 19 by the high-frequency power supply 36 of 13.56 MHz oscillation frequency.

In a first intermediate film forming process, only Ar gas, i.e., a sputtering gas, is supplied into the vacuum vessel 13, and the first intermediate film of titanium is formed over the inner surface 11b of the cylindrical member 11.

In a second intermediate film forming process, a mixed gas of Ar gas, i.e., a sputtering gas, and methane gas ($CH_4$ gas), i.e., a gas containing carbon, is supplied into the vacuum vessel 13, and the second intermediate film of titanium carbide ($TiC_x$) is formed on the first intermediate film of the inner surface 11b of the cylindrical member 11.

Example 6 is the same in other conditions, functions and effects as the two-layer intermediate film forming process in Examples 2 and 4, and hence further description of Example 6 will be omitted.

Two-Layer Intermediate Film Forming Process in Example 7: FIG. 5

Example 7 differs from Example 6 only in forming the second intermediate film of a metal silicide.

The two-layer intermediate film forming process in Example 7 uses the apparatus shown in FIG. 5 and forms the first intermediate film 12a by entirely the same process as that of Example 6.

After the first intermediate film has been formed over the inner surface 11b of a cylindrical member 11, a mixed gas of Ar gas, i.e., a sputtering gas, and monosilane gas which is a gas containing silicon is supplied through the gas inlet port 15 into the vacuum vessel 13.

The high-frequency power source 36 applies a high-frequency voltage of 13.56 MHz through the matching circuit 19 to an auxiliary electrode 23 to produce a plasma around the auxiliary electrode 23.

Titanium molecules sputtered from the auxiliary electrode 23 react with silicon in the monosilane gas and the second intermediate film of a titanium silicide (TiSi) is deposited on the first intermediate film 12a with a uniform thickness by reactive sputtering.

Example 7 is the same in other conditions, functions and effects as Examples 2 and 6, and hence further description of Example 7 will be omitted.

Two-Layer Intermediate Film Forming Process in Example 8: FIG. 6

A two-layer intermediate film forming process in Example 8 will be described hereinafter. The two-layer intermediate film forming process, similarly to the one-layer intermediate film forming process in Example 3, uses the apparatus shown in FIG. 6.

Example 8 differs from Example 4 only in that an auxiliary electrode 23 of titanium, i.e., a first intermediate film forming material, is inserted in the bore 11a of a cylindrical member 11, and an AC voltage is applied to the auxiliary electrode 23 so that a current of 10 A flows through the auxiliary electrode 23 by the AC power source 37.

The surface of the auxiliary electrode 23 of titanium is melted by resistance heating and a portion of the titanium evaporates. And the evaporated titanium molecules are deposited over the inner surface 11b of the cylindrical member 11. Thus, the titanium (Ti) film is formed as the first intermediate film with a uniform hickness over the inner surface 11b of the cylindrical member 11, by a resistance heating evaporation process.

Subsequently, a mixed gas of Ar gas, i.e., a sputtering gas, and methane gas ($CH_4$ gas), i.e., a gas containing carbon, is supplied into the vacuum vessel 13, and an AC voltage is applied to the auxiliary electrode 23 to produce a titanium vapor. The evaporated titanium molecules react with the carbon in the methane gas, and thus the second intermediate film of titanium carbide ($TiC_x$) is deposited on the first intermediate film coating the inner surface 11b of the cylindrical member 11 with a uniform of thickness, by resistance heating evaporation.

Example 8 is the same in other conditions, functions and effects as the two-layer intermediate film forming processes in Examples 3 and 4, and hence further description of Example 8 will be omitted.

Two-Layer Intermediate Film Forming Process in Example 9: FIG. 6

A two-layer intermediate film forming process in Example 9, which differs from Example 8 only in forming the second intermediate film of a metal silicide, will be described hereinafter.

The two-layer intermediate film forming process in Example 9 uses the apparatus shown in FIG. 6 and forms the first intermediate film by entirely the same process as that of Example 8.

After the first intermediate film has been formed over the inner surface 11b of a cylindrical member 11, a mixed gas of Ar gas and monosilane gas, which is a gas containing silicon, is supplied into the vacuum vessel 13.

Subsequently, the AC power source 37 applies an AC voltage to the auxiliary electrode 23. Consequently, the surface of the auxiliary electrode 23 of titanium is melted by resistance heating and titanium evaporates. And the evaporated titanium molecules react with silicon contained in the monosilane gas, and the second intermediate film of titanium silicide (TiSi) is deposited on the first intermediate film of the inner surface 11b of the cylindrical member 11 by a resistance heating evaporation process.

Example 9 is the same in other conditions, functions and effects as the two-layer intermediate film forming processes in Examples 3 and 5, and hence further description of Example 9 will be omitted.

Although each of the foregoing two-layer intermediate film forming processes employ the auxiliary electrode made of titanium (Ti), an auxiliary electrode made of molybdenum (Mo), tungsten (W), tantalum (Ta) or aluminum (Al) may be employed instead. When an auxiliary electrode of any one of these metals is used for forming the two-layer intermediate film, the first intermediate film is formed of the metal, and the second intermediate film is formed of a metal carbide or a metal silicide of the metal.

In the process for forming the second intermediate film, ethylene gas may be used as a gas containing carbon instead of methane ($CH_4$) gas. Furthermore, a disilane ($SiH_6$) gas may be used as a gas containing silicon instead of monosilane ($SiH_4$) gas.

The hard carbon film is formed by any one of the hard carbon film forming processes in Examples 1 to 3 on the one-layer intermediate film or the two-layer intermediate film formed over the inner surface 11b of the cylindrical member 11.

Although the intermediate film forming process and the hard carbon forming process may be carried out in separate vacuum vessels, the adhesion between the intermediate film and the hard carbon film formed continuously in one vacuum vessel is higher than that when the hard carbon film and the intermediate film are formed in separate vacuum vessels.

Any one of the foregoing intermediate film forming processes and any one of the foregoing hard carbon film forming processes may be used in combination, and variations are possible as mentioned above.

As is apparent from the foregoing description, in the intermediate film forming process and the hard carbon film forming process of the method of forming a film over the inner surface of a cylindrical member in accordance with the present invention, the auxiliary electrode is inserted in the bore of the cylindrical member, i.e., a base member, and a plasma is produced around the auxiliary electrode in the bore of the cylindrical member or resistance heating evaporation is carried out to form the intermediate film and the hard carbon film.

Since the auxiliary electrode at a ground potential or a negative DC potential is inserted in the bore of the cylindrical member, electrodes of an equal potential are not opposed directly to each other. Such a potentials condition is most desirable for plasma chemical vapor deposition (PCVD) and hollow discharge, i.e., abnormal discharge, does not occur. Therefore, the intermediate film and the hard carbon film stick to the contiguous surfaces with high adhesion.

Moreover, the hard carbon film and the intermediate film can be formed with a uniform thickness over the entire inner surface from the open end to the depth of the bore of the cylindrical member.

What is claimed is:

1. A method of forming films over an inner surface of a cylindrical member having a bore, said method comprising:

an intermediate film forming process comprising steps of:
placing the cylindrical member in a vacuum vessel,
inserting an electrode of an intermediate film forming material for enhancing adhesion of a hard carbon film in the bore of the cylindrical member, and keeping the cylindrical member at a ground potential or floating potential,
supplying a sputtering gas into the vacuum vessel after evacuating the vacuum vessel, and
applying a voltage to the electrode to produce a plasma around the electrode in the bore of the cylindrical member in order that the intermediate film forming material is sputtered from the electrode and is deposited so as to form an intermediate film over the inner surface of the cylindrical member; and a hard carbon film forming process comprising steps of:
keeping the electrode at a ground potential,
supplying a gas containing carbon into the vacuum vessel after evacuating the same, and
applying a voltage to the cylindrical member to produce a plasma in the vacuum vessel in order that a hard carbon film is deposited by plasma CVD process on the intermediate film formed over the inner surface of the cylindrical member,
wherein the intermediate layer forming process and the hard carbon film forming process are performed sequentially by using the same vacuum vessel.

2. The method of forming films according to claim 1, wherein a negative DC voltage is applied to the electrode to produce the plasma in the intermediate film forming process.

3. The method of forming a film according to claim 1, wherein a DC voltage is applied to the cylindrical member to produce the plasma in the vacuum vessel in the hard carbon film forming process.

4. The method of forming films according to claim 1, wherein an anode and a filament are disposed in the vacuum vessel, a DC voltage is applied to the cylindrical member, another DC voltage is applied to the anode and an AC voltage is applied to the filament to produce the plasma in the vacuum vessel in the hard carbon film forming process.

5. The method of forming films according to claim 1, wherein a high-frequency voltage is applied to the cylindrical member to produce the plasma in the vacuum vessel in the hard carbon film forming process.

6. The method of forming a film according to claim 1, wherein a high-frequency voltage is applied to the electrode to produce the plasma in the intermediate film forming process.

7. A method of forming films over an inner surface of a cylindrical member having a bore, said method comprising:
an intermediate film forming process comprising steps of:
placing the cylindrical member in a vacuum vessel,
inserting an electrode of an intermediate film forming material for enhancing adhesion of a hard carbon film in the bore of the cylindrical member, and keeping the cylindrical member at a ground potential or a floating potential,
supplying a mixed gas of argon gas and a gas containing carbon into the vacuum vessel after evacuating the vacuum vessel, and
applying a voltage to the electrode to produce a plasma around the electrode in the bore in order that the intermediate film forming material is sputtered from the electrode and reacts with carbon in the gas containing carbon to deposit an intermediate film of a metal carbide over the inner surface of the cylindrical member by reactive sputtering; and a hard carbon film forming process comprising steps of:
keeping the electrode at a ground potential,
supplying a gas containing carbon into the vacuum vessel after evacuating the same, and
applying a voltage to the cylindrical member to produce a plasma in the vacuum vessel in order that a hard carbon film is deposited by plasma CVD process on the intermediate film formed over the inner surface of the cylindrical member,
wherein the intermediate film forming process and the hard carbon film forming process are performed sequentially by using the same vacuum vessel.

8. The method of forming films according to claim 7, wherein a negative DC voltage is applied to the electrode to produce the plasma in the intermediate film forming process.

9. The method of forming films according to claim 7, wherein a high-frequency voltage is applied to the electrode to produce the plasma in the intermediate film forming process.

* * * * *